(12) United States Patent
Machida et al.

(10) Patent No.: US 6,232,216 B1
(45) Date of Patent: *May 15, 2001

(54) THIN FILM FORMING METHOD

(75) Inventors: Katsuyuki Machida, Kanagawa; Hakaru Kyuragi, Tokyo; Hideo Akiya, Kanagawa, all of (JP)

(73) Assignee: Nippon Telegraph and Telephone Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/835,992

(22) Filed: Apr. 11, 1997

(30) Foreign Application Priority Data

Apr. 16, 1996 (JP) .................................. 8-094015

(51) Int. Cl.⁷ .................................. C23C 16/511
(52) U.S. Cl. .................. 438/624; 438/695; 438/763; 427/569; 427/579; 427/255.7; 156/228; 156/247; 156/308.2
(58) Field of Search .................. 427/579, 569, 427/255.7; 156/308.2, 228, 247; 438/624, 763, 695

(56) References Cited

U.S. PATENT DOCUMENTS

| | | | |
|---|---|---|---|
| 4,732,761 | * 3/1988 | Machida et al. | 437/228 |
| 4,962,063 | * 10/1990 | Maydan et al. | 437/228 |
| 5,279,865 | * 1/1994 | Chebi et al. | 427/574 |
| 5,332,694 | * 7/1994 | Suzuki | 437/195 |
| 5,624,868 | * 4/1997 | Iyer | 438/762 |
| 5,763,954 | * 6/1998 | Hyakutake | 257/774 |
| 5,811,849 | * 9/1998 | Matsuura | 257/306 |
| 5,863,832 | * 1/1999 | Doyle et al. | 438/622 |
| 6,051,477 | * 4/2000 | Nam | 438/404 |

FOREIGN PATENT DOCUMENTS 4-356997  12/1992 (JP) .

OTHER PUBLICATIONS

K. Sato, S. Harada, A. Saiki, T. Kitamura, T. Okubo, and K. Mukai, "A Novel Planar Multilevel Interconnection Technology Utilizing Polyimide", IEEE Trans. Part Hybrid Package., PHP–9, 176(1973).

P. Elikins, K. Reinhardt, and R. Layer, "A planarization process for double metal CMOS using Spin–on Glass as a sacrificial layer, " Proceeding of 3rd International IEEE VMIC Conf., 100 (1986).

K. Ehara, T. Morimoto, S. Muramoto, and S. Matsuo, "Planar Interconnection Technology for LSI Fabrication Utilizing Lift–off Process", J. Electrochem. Soc., vol. 131, No. 2,419(1984).

C. Y. Ting, V. J. Vivalda, and H. G. Schaefer, "Study of Planarized Sputter–Deposited–SiO$_2$", J. Vac. Sci. Technol. 15, 1105(1978).

K. Machida and H. Oikawa, "SiO$_2$ Planarization Technology With Biasing and Electron Cyclotoron Resonance Plasma Deposition for Submicron Interconnections", J. Vac. Sci. Technol. B4, 818(1986).

W. J. Patrick, W. L. Guthrie, C. L. Standley, P. M. Schiable, "Application of Chemical Mechanical Polishing to the Fabrication of VLSI Circutit Interconnections", J. Electrochem. Soc., vol. 138, No. 6, Jun., 1778(1991).

* cited by examiner

*Primary Examiner*—Timothy Meeks
(74) *Attorney, Agent, or Firm*—Blakely Sokoloff Taylor & Zafman

(57) ABSTRACT

In this thin film forming method, a first thin film is formed on a semiconductor substrate having the step height by chemical vapor deposition using a high density plasma. A base member on which a second thin film is formed is placed on the semiconductor substrate such that the first and second thin films oppose each other. The semiconductor substrate is heated to a first temperature to form the second thin film on the first thin film. The base member is peeled off from the second thin film. The second thin film formed on the first thin film is heated to a second temperature higher than the first temperature.

9 Claims, 4 Drawing Sheets

THIN FILM FORMING METHOD

BACKGROUND OF THE INVENTION

The present invention relates to a thin film forming method.

Multilevel interconnection technologies are essential to realize electronic components with a higher density. In mounting techniques, multilevel interconnections are realized by performing heating and pressing at high temperatures as described in ceramic substrate fabrication methods (Japanese Patent Laid-Open No. 4-356997). However, when multilevel interconnections are formed in LSIs, no high-temperature processing can be performed because devices are mounted.

To realize a multilevel interconnection structure in an LSI, therefore, it is necessary to completely planarize the surface of a dielectric film formed between interconnections.

Conventional representative technologies of this planarization process are SOG (Spin-On-Glass) and PIQ (K. Sato, S. Harada, A. Saiki, T. Kitamura, T. Okubo, and K. Mukai, "A Novel Planar Multilevel Interconnection Technology Utilization Polyimide", IEEE Trans. Part Hybrid Package, PHP-9, 176 (1973)).

Other examples are etch back (P. Elikins, K. Reinhardt, and R. Layer, "A planarization process for double metal CMOS using Spin-on Glass as a sacrificial layer", Proceeding of 3rd International IEEE VMIC Conf., 100 (1986)) and lift off (K. Ehara, T. Morimoto, S. Muramoto, and S. Matsuo, "Planar Interconnection Technology for LSI Fabrication Utilizing Lift-off Process", J. Electrochem Soc., Vol. 131, No. 2, 419 (1984)).

On the other hand, bias-sputter was proposed as a simple planarization process (C. Y. Ting, V. J. Vivalda, and H. G. Schaefer, "Study of Planarized Sputter-Deposited-$SiO_2$", J. Vac. Sci. Technol. 15, 1105 (1978)).

Also, to be applied to finer interconnections, a planarization technology using bias ECR was proposed (K. Machida and H. Oikawa, "$SiO_2$ Planarization Technology with Biasing and Electron Cyclotron Resonance Plasma Deposition for Submicron Interconnections", J. Vac. Sci. Technol. B4, 818 (1986)).

In these methods, while film formation is being performed by sputtering or ECR plasma CVD, an RF bias is applied to a substrate to cause sputtering on a substrate holder. These thin film forming methods perform film formation while etching convex regions by using the angle dependence of sputtering on a substrate, thereby accomplishing planarization. The characteristic features of these technologies are that thin film characteristics are good even when films are formed at low temperatures and the planarization processes are simple.

In the 1990's, chemical mechanical polishing was proposed as a method of planarizing the surface of an interlayer dielectric (W. J. Patrick, W. L. Guthrie, C. L. Standley, and P. M. Schiable,"Application of Chemical Mechanical Polishing to the Fabrication of VLSI Circuit Interconnections", J. Electrochem. Soc., Vol. 138, No. 6, June, 1778 (1991)). This chemical mechanical polishing attracted attention because a high degree of planarization could be obtained.

Recently, the diameter of substrates (wafers) on which semiconductor devices are formed have been increased steadily from 8 to 12 inches. When the above planarization technologies are applied to such large-diameter wafers, it is difficult for conventional thin film forming methods to secure the planarity and the uniformity of a film thickness over a broad range with a high controllability.

First, although SOG can easily form thin films, this method can be used only to, e.g., locally deposit a fine interconnection space or perform partial planarization.

Etch back is a technology being most extensively used but has the problem that dust is produced due to simultaneous etching of a resist and a dielectric film. Accordingly, etch back is not an easy technology in terms of control of dust and has a problem in the viewpoint of controllability.

On the other hand, lift off has the problem that a stencil used cannot be lifted off because this material does not completely dissolve during lift off. Due to the resulting insufficient controllability and yield, lift off has not been put into practical use.

Also, when the planarization technology using bias-sputter or bias ECR alone is used to perform planarization completely, the results are a low throughput (productivity) and damages to devices.

In chemical mechanical polishing, good chemical mechanical polishing characteristics cannot be obtained if the thin film characteristics of a dielectric film are unsatisfactory. Therefore, a high-quality dielectric film is necessary to be deposited at low temperatures. Additionally, this chemical mechanical polishing has a problem in controllability such as unstable chemical mechanical polishing characteristics.

SUMMARY OF THE INVENTION

It is, therefore, a principal object of the present invention to secure a high planarity and a high film thickness uniformity with a high controllability so as to cope with an increase of the diameter of wafers on which semiconductor devices are formed, and to form thin films at a low cost without producing dust.

To achieve the above object, there is provided a thin film forming method comprising the first step of forming a first thin film on a semiconductor substrate having a step height by chemical vapor deposition using a high density plasma, the second step of placing a base member on which a second thin film is formed on the semiconductor substrate such that the first and second thin films oppose each other, the third step of heating the semiconductor substrate to a first temperature to form the second thin film on the first thin film, and the fourth step of peeling off the base member from the second thin film.

DESCRIPTION OF THE PREFERRED EMBODIMENTS

Embodiments of the present invention will be described below with reference to the accompanying drawings.

First Embodiment

Figure 1:
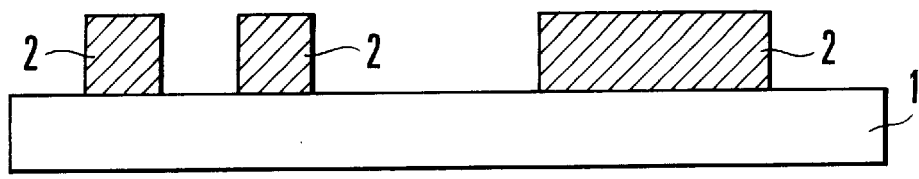
FIGS. 1A to 1C are views for explaining a thin film forming method in one embodiment of the present invention.
Figure 1:
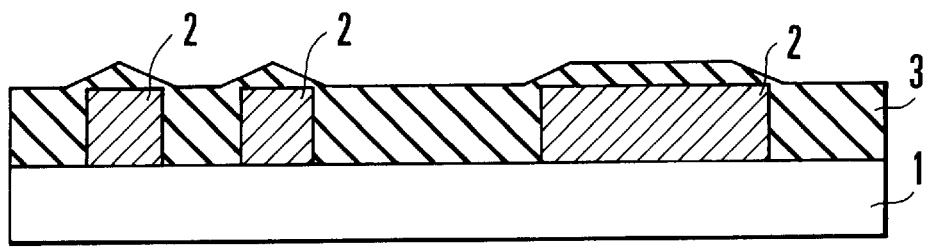
Figure 1:
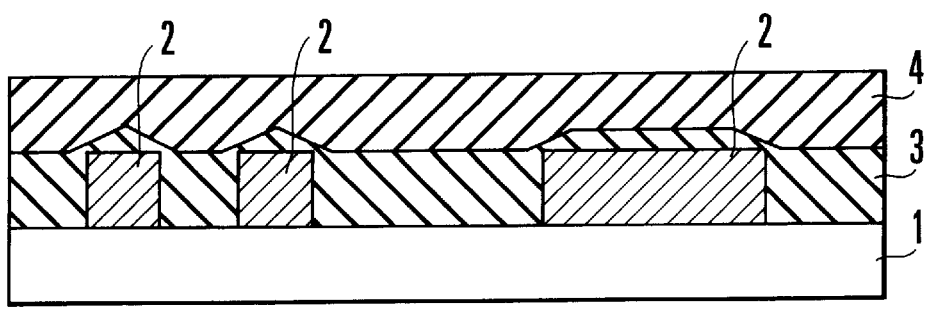

FIGS. 1A to 1C illustrate thin film formation in the first embodiment of the present invention.

First, as shown in FIG. 1A, Al interconnections 2 were formed on a semiconductor substrate 1.

These Al interconnections 2 were formed by forming an Al layer having a thickness of 0.5 μm on the semiconductor substrate 1 by sputtering, and forming an interconnection pattern by photolithography and dry etching.

Subsequently, as shown in FIG. 1B, a dielectric film 3 (a first thin film) was formed by high density plasma CVD on the semiconductor substrate 1 on which the Al interconnections 2 were formed.

In the high density plasma CVD of this embodiment, a plasma was generated by electron cyclotron resonance, and a thin film was formed by applying an RF bias to the semiconductor substrate 1.

In this manner, the dielectric film 3 having the same thickness of 0.5 μm as the Al interconnections 2 was formed. The formation of this dielectric film 3 was done by using silane and oxygen gases at a gas pressure of 1.0 mTorr, a microwave power of 900 W, and an RF power density of 0.5 W/cm².

By forming a silicon oxide film by the above method, the dielectric film 3 can be readily formed between the Al interconnections 2.

Also, by the use of the above film formation, a convex shape on the surface of the dielectric film 3 formed is inclined or has a triangular shape on protrusions such as the Al interconnections 2. This decreases the step height of the underlying layer to some extent.

Additionally, the dielectric film formed by ECR plasma CVD has good thin film characteristics. Since the Al interconnections 2 are covered with this dielectric film, the interconnections 2 are protected from a pressure produced in the subsequent placing step.

Thereafter, a dielectric film 4 (a second thin film) was formed on the dielectric film 3 by using a sheet film (base member) 5 (FIG. 2) having the surface on which the dielectric film 4 was formed in advance.

As this sheet film 5, a thermoplastic synthetic resin film was used. Also, the dielectric film 4 was formed to have a thickness of about 2 μm by coating the surface of the sheet film 5 with a coating solution for forming a silica-based dielectric film. This coating solution contains one or two types of polysilazane as an SOG material represented by formula 1 below.

[Formula 1]

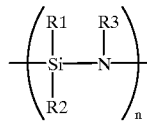

In formula 1, R1, R2, and R3 independently represent a hydrogen atom or an alkyl, aryl, or alkoxyl group having 1 to 8 carbon atoms.

In the above process, although the sheet film 5 made from a thermoplastic synthetic resin film was used as a base member, a metallic film or a flat plate can also be used.

Also, in the above process, a dielectric film was formed on the sheet film 5. However, a thin film is not limited to a dielectric film. For example, a thin metallic film can also be formed as long as the film can be formed on the sheet film 5.

Figure 3A:
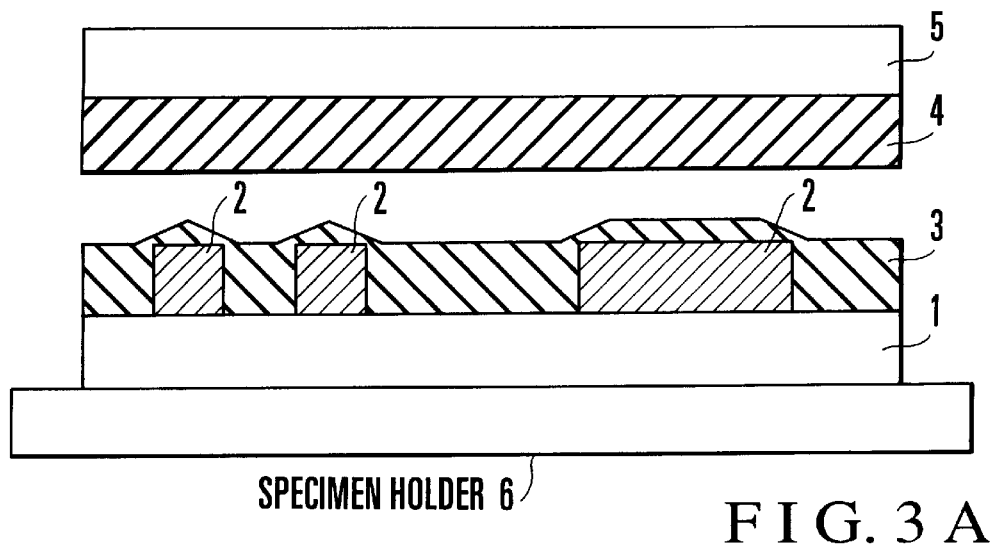
FIGS. 3A to 3C are views showing the steps of placing on a dielectric film 3 the dielectric film 4 formed on the sheet film 5 and transferring the dielectric film 4 to the dielectric film 3.
Figure 3B:
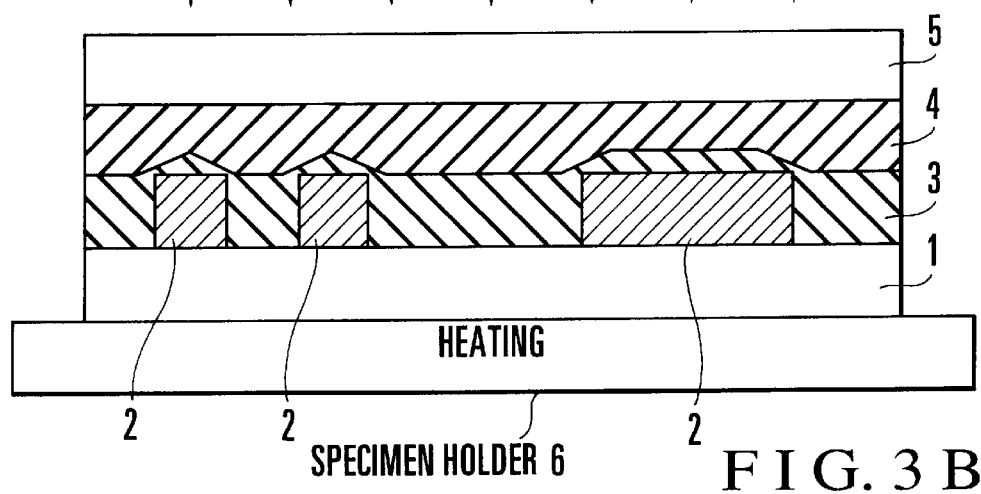
Figure 3C:
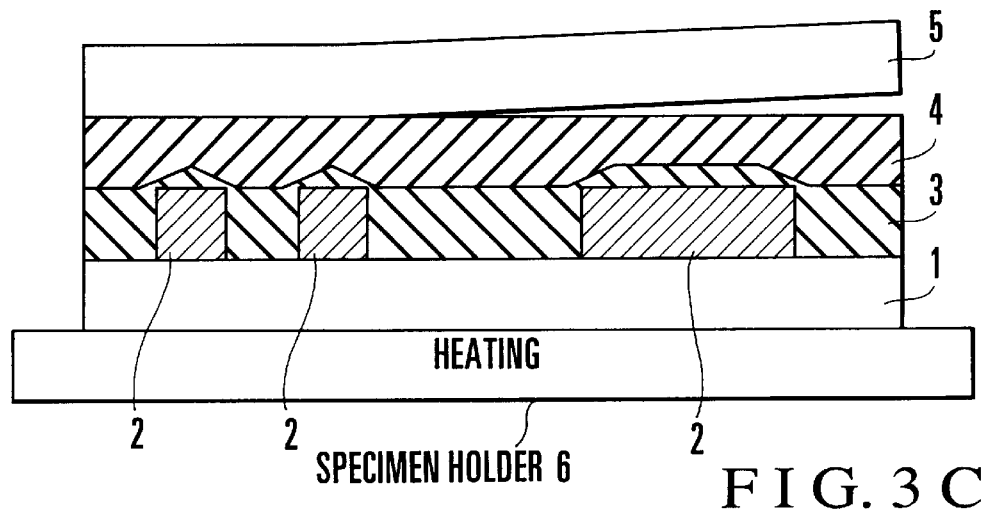

The sheet film 5 for forming the dielectric film 4 on the dielectric film 3 was placed as shown in FIGS. 3A to 3C.

As shown in FIG. 3A, the semiconductor substrate 1 was fixed on a specimen holder 6 having a heating means. The sheet film 5 was then placed such that the surface on which the dielectric film 4 was formed opposed the surface of the semiconductor substrate 1.

As shown in FIG. 3B, a pressure of about 5 kg was applied from the back surface of the sheet film 5, i.e., from above the sheet film 5 in the stacked state by, e.g., placing a weight, thereby adhering the dielectric film 4 of the sheet film 5 to the surface of the dielectric film 3. Simultaneously, the semiconductor substrate 1 was heated to 150° C. while being fixed on the specimen holder 6. This heating was done for 10 min.

Thereafter, as shown in FIG. 3C, the sheet film 5 was peeled off, and annealing was performed in a nitrogen ambient by heating the resultant structure to 400° C. for 30 min.

Consequently, as shown in FIG. 1C described above, the dielectric film 4 which planarized the step height on the surface of underlying dielectric film 3 and had a flat surface was formed. The step height on the surface of the dielectric film 3 was planarized by the heat and the pressure during transfer. The thickness of thick portions of the dielectric film 4 was found to be 1 μm.

In this first embodiment as described above, a dielectric film (first thin film) is formed in interconnection spaces and on interconnections by using high density plasma CVD in order to decrease the step height to some extent and protect the interconnections. This eliminates the problems of a low throughput and damages to devices. Also, a dielectric film (second thin film) formed on a sheet film is transferred. Consequently, this dielectric film can be easily formed on the CVD dielectric film, and the surface of the dielectric film can be planarized.

As described above, this embodiment allows easy formation of a thin film such as a planarized dielectric film, which largely differs from the concept of conventional planarization using etching or chemical mechanical polishing after formation of a dielectric film.

Additionally, the area of a base member such as a sheet film can be easily increased. Therefore, this embodiment is readily adaptable with a high controllability to an increase in size of substrates on which thin films are formed.

Second Embodiment

The second embodiment of the present invention will be described below.

A dielectric film (third thin film) having better thin film characteristics than the dielectric film 4 (FIG. 1C) explained in the first embodiment can be additionally formed on the dielectric film 4.

Figure 4:
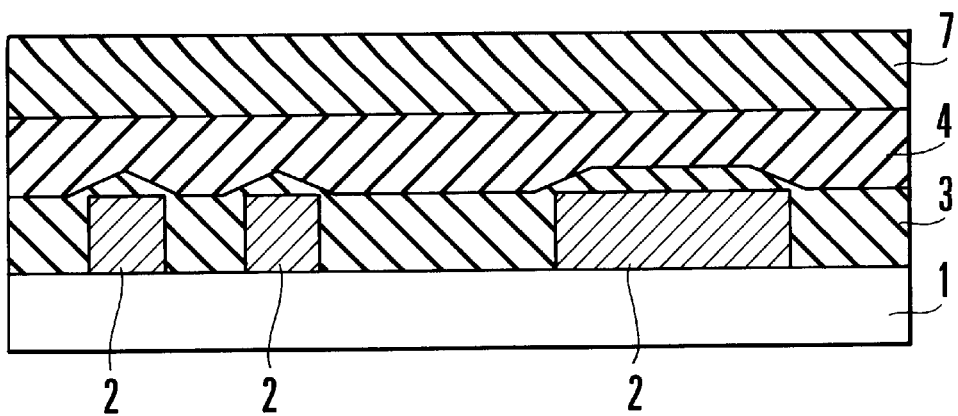
FIG. 4 is a sectional view showing thin film formation in the second embodiment.

FIG. 4 shows thin film formation in this second embodiment. In the second embodiment, after the formation of the dielectric film 4 shown in FIG. 1C of the first embodiment, a dielectric film 7 deposited by high density plasma CVD was formed.

This dielectric film 7 was formed by depositing a 200-nm thick $SiO_2$ film by CVD using an ECR plasma. The deposition conditions were such that silane and oxygen gases were used as the materials of CVD, the gas pressure was 1.0 mTorr, and the microwave power for generating the plasma was 900 W. In this film formation, it is also possible to apply an RF bias.

By the formation of the dielectric film 7, the dielectric film 4 was sandwiched between a dielectric film 3 and the dielectric film 7. The thickness of each of these dielectric films was found to be 1.2 μm in thick portions.

In the first embodiment described above, the dielectric film 4 contains, as a material which flows to achieve planarization when heated, one or two types of polysilazane as an SOG material represented by formula 1. Therefore, the dielectric film 4 sometimes deteriorates by absorbing moisture in the ambient.

In this second embodiment as described above, however, the dielectric film 4 is sandwiched between the dielectric films 3 and 7, and the dielectric films 3 and 7 are high-quality films which do not allow water to penetrate. This avoids deterioration of the dielectric film 4.

In this second embodiment as shown in FIG. 4, as in the first embodiment, the dielectric film 7 is planarized without being influenced by the step height of underlying Al interconnections 2.

From the foregoing, in this second embodiment, a subsequent process of forming interconnections on this dielectric film 7 can be performed with a high reproducibility.

Also, when the thickness of the dielectric film on the interconnections 2 is to be increased, this film thickness can be corrected by controlling the thickness of the dielectric film 7.

Third Embodiment

The third embodiment of the present invention will be described below.

In the first and second embodiments described above, a dielectric layer formed on interconnections is formed thick so as to bury the interconnections. However, the present invention is not limited to these embodiments.

Figure 5:
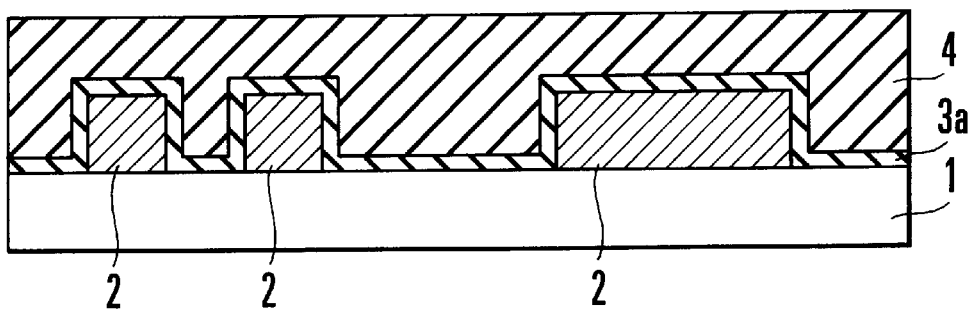
FIG. 5 is a sectional view showing thin film formation in the third embodiment.

As shown in FIG. 5, on a semiconductor substrate 1 including electrode Al electrode interconnections 2, a dielectric film 3a thinner than the interconnections can also be formed.

This dielectric film 3a was formed to have a thickness of about 200 nm by CVD using an ECR plasma as a high density plasma. In this film formation, $SiO_2$ was deposited. Silane and oxygen gases were used as the source gases, the gas pressure was 1.0 mTorr, the microwave power was 900 W, and the RF power density was 0.5 $W/cm^2$.

That is, in this third embodiment, the dielectric film 3a is formed to protect the Al interconnections 2, and the purpose of the dielectric film 3a is to cover the Al interconnections 2. Therefore, as described above, the dielectric film 3a in the third embodiment is thin unlike in the first and second embodiments described above.

Figure 2:
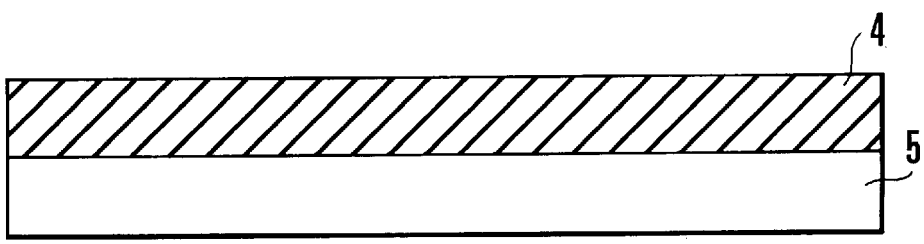
FIG. 2 is a sectional view showing the structure of a sheet film 5 on which a dielectric film 4 is formed.

In this third embodiment, as in the above first embodiment, a sheet film 5 on which a dielectric film 4 as shown in FIG. 2 was formed was transferred on this thin dielectric film 3a, thereby forming the dielectric film 4 on the dielectric film 3a.

Consequently, as in the first embodiment, the dielectric film 4 planarized the step height on the underlying layer due to heating during placing, and the surface of the dielectric film 4 was planarized. That is, the dielectric film 4 having a flat surface was formed. The thickness of thick portions of the formed dielectric film was found to be 1.2 μm.

In this third embodiment as described above, although the dielectric film 4 for planarization is formed by placing, reliability of the Al interconnections 2 as interconnections can be secured because the Al interconnections 2 are covered with the dielectric film 3a.

That is, the dielectric film 3a is a high-quality dielectric film formed by a high density plasma even though the film is thin. Therefore, the Al interconnections 2 covered with this film is protected from, e.g., a pressure applied in the placing step. Also, in annealing performed in water vapor after the placing, the dielectric film 3a prevents water vapor from reaching the Al interconnections 2. This protects the Al interconnections 2 from corrosion.

Note that the thickness of the dielectric film 3a is not limited to 200 nm described above. For example, the dielectric film 3a need only have a thickness by which corrosion of the Al interconnections 2 in annealing in water vapor can be prevented.

Fourth Embodiment

The fourth embodiment of the present invention will be described below.

In the above first to third embodiments, a dielectric film for planarization is formed by placing on a dielectric film formed by CVD using a high density plasma. However, the present invention is not limited to these embodiments. It is also possible to form an SOG (Spin on Glass) film by coating on a dielectric film formed by CVD using a high density plasma and to form a dielectric film for planarization on this SOG film by placing. If interconnection spaces between interconnections below the dielectric film are narrow, these narrow spaces are filled with the SOG film.

Figure 6:
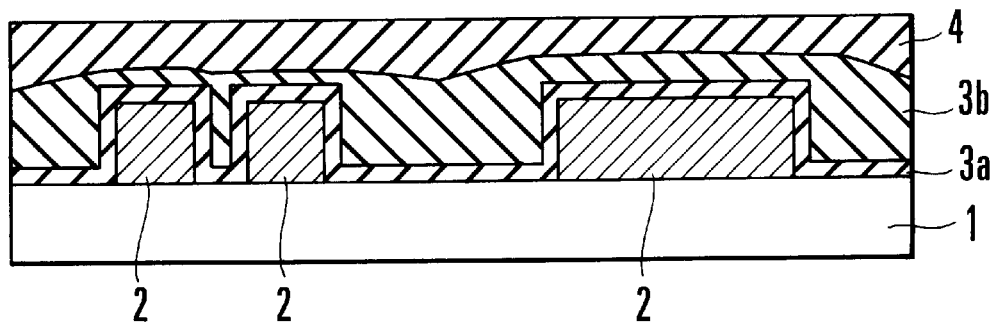
FIG. 6 is a sectional view showing thin film formation in the fourth embodiment.

FIG. 6 shows the state of thin film formation in this fourth embodiment. As shown in FIG. 6, in the fourth embodiment, a dielectric film 3a is formed on a semiconductor substrate 1 on which Al interconnections 2 are formed. This dielectric film 3a was formed in the same manner as in the third embodiment.

An SOG film 3b is formed on this dielectric film 3a. This SOG film 3b was formed by coating the surface of the semiconductor substrate 1, on which the Al interconnections 2 and the dielectric film 3a were formed, with a 0.5-μm thick material of the SOG film 3b by spin coating, and sintering the resultant structure by heating to 400° C. in a nitrogen ambient.

Consequently, as shown in FIG. 6, the SOG film 3b was formed even in narrow interconnection spaces, so planarization to a certain degree was done in this stage of formation of the SOG film 3b. Since a dielectric film 4 was formed on the SOG film 3b by placing, a small step height in a wide interconnection space was eliminated. This further planarized the surface of the dielectric film 4. The thickness of thick portions of the finally obtained dielectric film was found to be 1.4 μm.

Fifth Embodiment

The fifth embodiment of the present invention will be described below.

Figure 7:
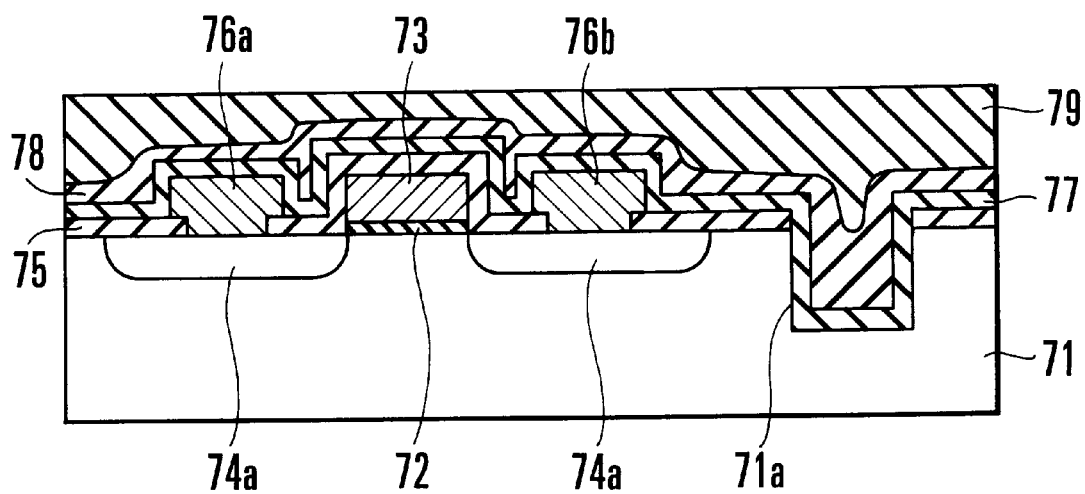
FIG. 7 is a sectional view showing the state of thin film formation in the fifth embodiment.

FIG. 7 shows the section of a semiconductor device indicating the state of thin film formation in this fifth embodiment. Referring to FIG. 7, a MOSFET is formed, as will be described below. That is, a gate electrode 73 is formed on a semiconductor substrate 71 via a gate dielectric film 72. A source 74a and a drain 74b are formed on two sides of the gate electrode 73 on the semiconductor substrate 71 by doping an impurity by ion implantation or the like. A source electrode 76a and a drain electrode 76b are ohmic-connected to the source 74a and the drain 74b, respectively, via a dielectric film 75 in which holes are formed.

Also, a trench 71a for device isolation is formed in the semiconductor substrate 71.

Even when device components or the step height exists as described above, the surface of the structure can be planarized by forming an SOG film 78 and placing a dielectric film 79 for planarization as in the fourth embodiment described above.

In the thin film forming method of the present invention, as has been described above, a first thin film is formed on a semiconductor substrate having convex andoconcave regions by chemical vapor deposition using a high density plasma. A base member on which a second thin film is formed and the semiconductor substrate are placed such that the first and second thin films oppose each other. The semiconductor substrate is then heated to a first temperature to form the second thin film on the first thin film. Subsequently, the base member is peeled,off from the second thin film.

When the second thin film is formed on the first thin film by placing as described above, the step height on the first thin film is planarized with the second thin film, and the surface of the second thin film is planarized. Consequently, the present invention is readily adaptable to an increase in diameter of wafers on which semiconductor devices are formed. That is, the planarity and the uniformity of a film thickness can be secured with a high controllability even on a large-diameter wafer. Additionally, thin films can be formed at a low cost without producing dust.

Another embodiment of the present invention also has the above advantages. In addition, after the second thin film formed on the first thin film is heated to a second temperature higher than the first temperature, a third thin film is formed on the second thin film by chemical vapor deposition using a high density plasma.

Since the third thin film is formed as above, the planarity and the uniformity of a film thickness can be secured with a high controllability even on a large-diameter wafer. Additionally, thin films can be formed at a low cost without producing dust. Furthermore, the second thin film is protected from stress in the process after the formation of the third thin film. This allows a high quality to be held.

In still another embodiment of the present invention, a first thin film is formed on a semiconductor substrate having the step height by chemical vapor deposition using a high density plasma, and a second thin film is formed on the first thin film by coating. A base member on which a third thin film is formed and the semiconductor substrate are placed such that the second and third thin films oppose each other. The semiconductor substrate is then heated to a first temperature to form the third thin film on the second thin film. Subsequently, the base member is peeled off from the third thin film.

When the second thin film is formed on the first thin film by placing as described above, concave portions on the first thin film are filled with the second thin film, and the step height of the second thin film is planarized by the third thin film. Consequently, the present invention is readily adaptable to an increase in diameter of wafers on which semiconductor devices are formed. That is, the planarity and the uniformity of a film thickness can be secured with a high controllability even on a large-diameter wafer. Additionally, thin films can be formed at a low cost without producing dust. Also, even if fine concave regions exist in the semiconductor substrate, these regions can be planarized.

What is claimed is:

1. A thin film forming method comprising:
    the first step of forming a first thin film on a semiconductor substrate having irregularities by filling voids in said irregularities and covering said irregularities through chemical vapor deposition using a high density plasma so as to reduce a difference in step height in the irregularities on said semiconductor substrate and to protect said irregularities from a subsequent applied pressure to said irregularities;
    the second step of placing a base member on which a second thin film showing flowage at a first temperature is formed on said semiconductor substrate such that said first and second thin films oppose each other;
    the third step of adhering to the surface of said first thin film said second thin film having its surface flattened by subsequently heating said semiconductor substrate to said first temperature and applying a pressure between said base member and said semiconductor substrate so as to reduce a difference in step height in the protected irregularities on the surface of said first thin film; and
    the fourth step of peeling off said base member from said second thin film.

2. A method according to claim 1, wherein a semiconductor device is formed on the surface having the step height of said semiconductor substrate.

3. A method according to claim 1, wherein a trench is formed on the surface having the step height of said semiconductor substrate.

4. A method according to claim 1, wherein a thickness of said second thin film formed on the base member surface is not less than a step height on said semiconductor substrate.

5. A method according to claim 1, wherein the first temperature is lower than a tolerance temperature of said base member.

6. A method according to claim 1, wherein said second thin film is made from a dielectric.

7. A method according to claim 1, wherein
    the high density plasma is generated by electron cyclotron resonance, and
    said first thin film is formed by applying an RF bias to said semiconductor substrate.

8. A method according to claim 1, further comprising:
    the fifth step of heating said second thin film formed on said first thin film to a second temperature higher than the first temperature; and
    the sixth step of forming a third thin film on said second thin film by chemical vapor deposition using a high density plasma.

9. A thin film forming method comprising:
    the first step of forming a first thin film on a semiconductor substrate having irregularities by filling voids in said irregularities and covering said irregularities through chemical vapor deposition using a high density plasma so as to reduce a difference in step height in the irregularities on said semiconductor substrate and to protect said irregularities from a subsequent applied pressure to said irregularities;
    the second step of forming a second thin film on said first thin film by coating;
    the third step of placing a base member on which a third thin film showing flowage at a first temperature is formed on said semiconductor substrate such that said second and third thin films oppose each other;
    the fourth step of adhering to the surface of said second thin film said third thin film having its surface flattened by subsequently heating said semiconductor substrate to said first temperature and applying a pressure between said base member and said semiconductor substrate so as to reduce a difference in step height in the protected irregularities on the surface of said second thin film; and the fifth step of peeling off said base member from said third thin film.

* * * * *